United States Patent
Bauer et al.

(10) Patent No.: US 8,906,749 B2
(45) Date of Patent: Dec. 9, 2014

(54) METHOD FOR FABRICATING A SEMICONDUCTOR DEVICE

(75) Inventors: Michael Bauer, Nittendorf (DE); Daniel Porwol, Straubing (DE); Ulrich Wachter, Regensburg (DE)

(73) Assignee: Infineon Technologies AG, Neubiberg (DE)

(*) Notice: Subject to any disclaimer, the term of this patent is extended or adjusted under 35 U.S.C. 154(b) by 148 days.

(21) Appl. No.: 13/432,633

(22) Filed: Mar. 28, 2012

(65) Prior Publication Data
US 2013/0256922 A1 Oct. 3, 2013

(51) Int. Cl.
*H01L 21/00* (2006.01)
*H01L 23/22* (2006.01)

(52) U.S. Cl.
USPC ........... 438/126; 438/127; 438/795; 257/687; 257/789; 257/795

(58) Field of Classification Search
CPC ..... H01L 21/563; H01L 21/561; H01L 23/16; H01L 23/4334; H01L 31/0203
See application file for complete search history.

(56) References Cited

U.S. PATENT DOCUMENTS

| | | | | |
|---|---|---|---|---|
| 7,830,026 B2 * | 11/2010 | Beer et al. | | 257/789 |
| 8,459,561 B2 * | 6/2013 | Aoki et al. | | 235/492 |
| 8,502,367 B2 * | 8/2013 | Luan | | 257/686 |
| 2002/0167804 A1 * | 11/2002 | Towle | | 361/765 |
| 2004/0217472 A1 * | 11/2004 | Aisenbrey et al. | | 257/734 |
| 2008/0259583 A1 * | 10/2008 | Rietzler | | 361/807 |
| 2009/0065590 A1 | 3/2009 | Aoki et al. | | |
| 2012/0068364 A1 | 3/2012 | Mengel et al. | | |
| 2012/0074599 A1 * | 3/2012 | Kim | | 257/793 |
| 2013/0095282 A1 * | 4/2013 | Taketa et al. | | 428/113 |

* cited by examiner

*Primary Examiner* — Alonzo Chambliss
(74) *Attorney, Agent, or Firm* — Slater & Matsil, L.L.P.

(57) ABSTRACT

A semiconductor device and a method for making a semiconductor device are disclosed. In an embodiment a semiconductor device includes a semiconductor chip and a fiber reinforced encapsulation layer at least partly covering the semiconductor chip.

18 Claims, 6 Drawing Sheets

METHOD FOR FABRICATING A SEMICONDUCTOR DEVICE

TECHNICAL FIELD

The present invention relates to a method for fabricating a semiconductor device and to a semiconductor device.

BACKGROUND

Semiconductor devices can be fabricated by covering a main surface of a semiconductor chip and adjacent side faces with an encapsulation material. The contact pads are arranged on the other main surface of the semiconductor chip and can be connected to external contact pads of the semiconductor device by means of a redistribution layer. The packaging of the semiconductor chips by the encapsulation material can be done on a wafer level by means of, for example, the so-called extended wafer level packing in which a plurality of semiconductor chips are arranged on a carrier and the encapsulation material is molded over the semiconductor chips in a molding apparatus. The panel thus produced is also called a reconfigured wafer.

The practice has shown that the currently utilized mold processes and materials may lead to instabilities of the form and shape of the reconfigured wafer. Depending on the process conditions, in particular the temperature, undefined and uncontrolled warpage of the reconfigured wafer may occur. For that reason the molding process is carried out at lower temperatures in order to reduce or avoid the warpage. In case that the planarity of the molded reconfigured wafer is not satisfactory, an additional temperature process has to be performed in order to correct or adjust the warpage. This additional warpage adjust temperature process increases the overall fabrication costs and, moreover, mechanical stress may be incorporated into the reconfigured wafer by this process. This mechanical stress may then decline in succeeding process steps in an uncontrolled manner. On the other hand, when using a reduced mold temperature, a reconfigured wafer may result which is not stably cured or hardened.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION OF ILLUSTRATIVE EMBODIMENTS

Figure 1:
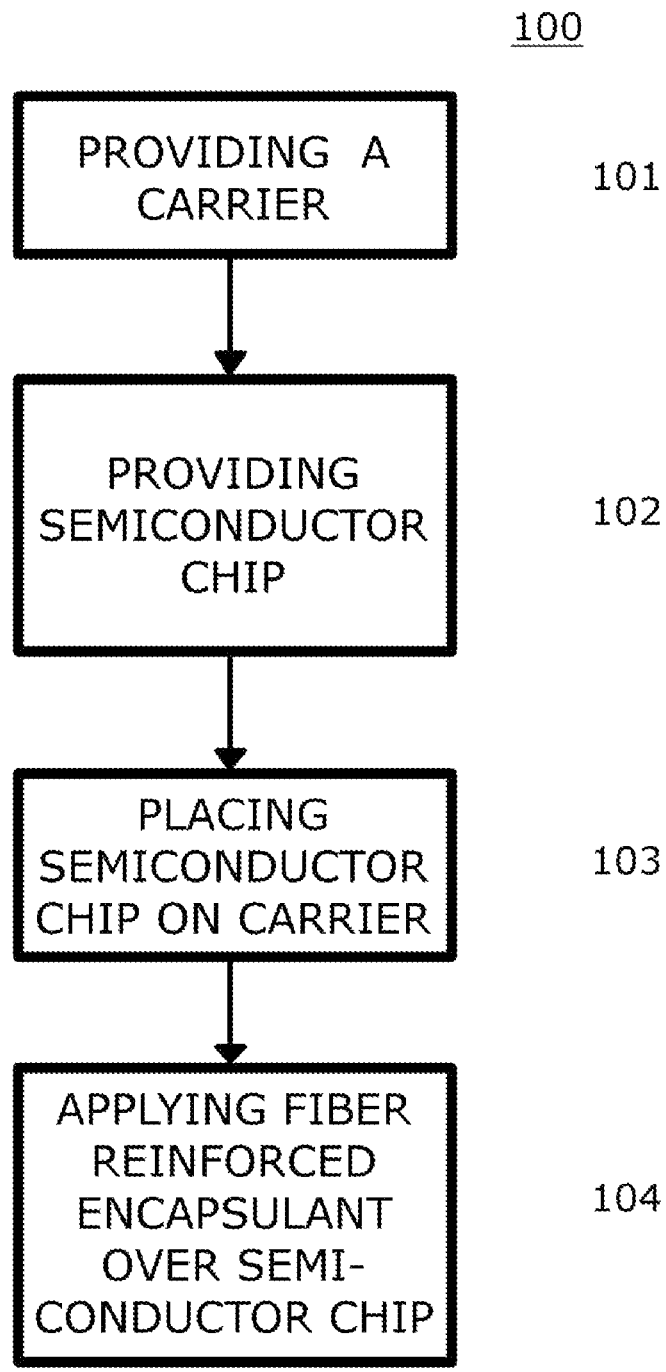
FIG. 1 illustrates a flow diagram for an exemplary method for fabricating a semiconductor device according to a first aspect of the disclosure.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the disclosure. It may be evident, however, to one skilled in the art that one or more aspects of the embodiments may be practiced with a lesser degree of the specific details. In other instances, known structures and elements are shown in schematic form in order to facilitate describing one or more aspects of the disclosure. It is to be understood that other embodiments may be utilized and structural or logical changes may be made without departing from the scope of the disclosure. It should be noted further that the drawings are not to scale or not necessarily to scale.

In addition, features or aspects disclosed may be combined with one or more other features or aspects of the other implementations as may be desired and advantageous for any given or particular application. The terms "coupled" and "connected," along with derivatives may be used. It should be understood that these terms may be used to indicate that two elements co-operate or interact with each other regardless of whether they are in direct physical or electrical contact, or they are not in direct contact with each other. The following detailed description, therefore, is not to be taken in a limiting sense, and the scope of the present invention is defined by the appended claims.

The examples of a method for fabricating a semiconductor device and the examples of a semiconductor device may use various types of semiconductor chips or circuits incorporated in the semiconductor chips, among them logic integrated circuits, analog integrated circuits, mixed signal integrated circuits, sensor circuits, MEMS (Micro-Electro-Mechanical-Systems), power integrated circuits, chips with integrated passives, etc. The embodiments may also use semiconductor chips comprising MOS transistor structures or vertical transistor structures like, for example, IGBT (Insulated Gate Bipolar Transistor) structures or, in general, transistor structures in which at least one electrical contact pad is arranged on a first main face of the semiconductor chip and at least one other electrical contact pad is arranged on a second main face of the semiconductor chip opposite to the first main face of the semiconductor chip.

In several examples layers or layer stacks are applied to one another or materials are applied or deposited onto layers. It should be appreciated that any such terms as "applied" or "deposited" are meant to cover literally all kinds and techniques of applying layers onto each other. In particular, they are meant to cover techniques in which layers are applied at once as a whole like, for example, laminating techniques as well as techniques in which layers are deposited in a sequential manner like, for example, sputtering, plating, molding, CVD, etc.

The semiconductor chips may comprise contact elements or contact pads on one or more of their outer surfaces wherein the contact elements serve for electrically contacting the semiconductor chips. The contact elements may have any desired form or shape. They can, for example, have the form of lands, i.e., flat contact layers on an outer surface of the semiconductor package. The contact elements or contact pads may be made from any electrically conducting material, e.g., from a metal such as aluminum, gold, or copper, for example, or a metal alloy, or an electrically conducting organic material, or an electrically conducting semiconductor material.

The semiconductor chips may become covered with an encapsulant or encapsulating material. The encapsulating material can be any electrically insulating material like, for example, any kind of molding material, any kind of epoxy material, or any kind of resin material. In special cases it could be advantageous to use a conductive encapsulant material. In the process of covering the semiconductor chips or dies with the encapsulating material, fan-out embedded dies can be fabricated. The fan-out embedded dies can be arranged in an array having the form, e.g., of a wafer and will thus be called a "re-configured wafer" further below. However, it should be appreciated that the fan-out embedded die array is not limited to the form and shape of a wafer but can have any size and shape and any suitable array of semiconductor chips embedded therein.

FIG. 1 illustrates a flow diagram of an exemplary method for fabricating a semiconductor device according to a first aspect of the disclosure. The method 100 comprises providing a carrier (101), providing at least one semiconductor chip (102), placing the semiconductor chip onto the carrier (103), and applying a fiber reinforced encapsulant material over the semiconductor chip (104).

The method can be performed in such a way that applying the fiber reinforced encapsulant material provides an encapsulant layer in which a plurality of fibers is embedded. The fibers can be embedded in different ways within the encapsulant layer. According to an example, at least a part of the fibers or each one of the fibers may extend from one surface of the fiber enforced encapsulation layer to another surface, in particular a surface opposed to the one surface, of the fiber enforced encapsulation layer. According to another example, at least a part of the fibers or each one of the fibers may be totally embedded within the fiber enforced encapsulation layer so that they do not extend to anyone of the surfaces of the fiber enforced encapsulation layer.

The fibers can in principle be made out of any material. In particular, the fibers can be comprised of one or more of organic fibers, inorganic fibers, glass fibers, carbon fibers, plastic fibers, basalt fibers, natural fibers, ceramic fibers, and metal fibers. They can be made out of only one and the same material, but also different materials can be used.

The fibers can be interconnected in order to form any sort of network. In particular, the fibers can be interconnected in the form of one or more of a mat, a mesh, a woven material, a knit, and a braid. The fibers can also be arranged in such a way that they are not interconnected but instead formed as separate fibers which are not interconnected and which may be arranged in the form of an unidirectional fiber sheet.

The fiber reinforced encapsulant material can be applied by molding, in particular by transfer molding or compression molding. In particular, the carrier with the semiconductor chip can be placed within a conventional molding apparatus, a fiber layer, which can have the form of a fibrous mat or mesh, can be applied onto the semiconductor chip and the upper surface of the carrier. Thereafter, the encapsulant material is molded over the semiconductor chip followed by a step of curing or hardening of the molded encapsulant material in order to yield a packaged semiconductor device.

According to an example, which will be shown later in more detail, in a wafer level fabrication process a plurality of semiconductor devices is fabricated by providing a plurality of semiconductor chips, placing the semiconductor chips onto the carrier, fabricating a panel by applying the fiber reinforced encapsulant material over the plurality of semiconductor chips. Finally the panel is singulated in order to obtain a plurality of semiconductor devices.

The encapsulant material to be used can be any sort of plastic material, in particular a duroplastic or thermoplastic material, in particular any sort of resin material as, for example, epoxy resin material.

The fibers may occupy a percentage of the total volume of the encapsulation layer in a range between 20% to 70%.

In general, some or all of the material parameters like, for example, material types of the encapsulant material or the fibers, the thickness of the fibers, the length of the fibers, the volume percentage of the fibers in relation to the total volume of the encapsulation layer, can be chosen such that specific desired material properties can be obtained. One of these material properties is the mechanic stability or stiffness of the encapsulation layer which can be measured in terms of the elastic modulus. For example, the material parameters as listed above could be chosen such that the elastic modulus of the encapsulation layer is greater than 1 GPa, more specifically greater than 3 GPa, more specifically greater than 5 GPa, more specifically greater than 10 GPa. Another material property of the encapsulation layer is the coefficient of thermal expansion (CTE). The material parameters as listed above could be chosen such that the CTE is smaller than $10^{-5}$ $K^{-1}$, more specifically smaller than $5\times10^{-6}$ $K^{-1}$. Alternatively, it may not be important to obtain a specific absolute value of the CTE but to obtain such a value which is similar to or near to the CTE of the material of the semiconductor chip, which is silicon in most cases. For example, the material parameters as listed above could be chosen such that the CTE of the fabricated encapsulation layer is no more than x % higher than the CTE of silicon, where x can be, for example, 10%, 20%, 30%.

Figure 2A:
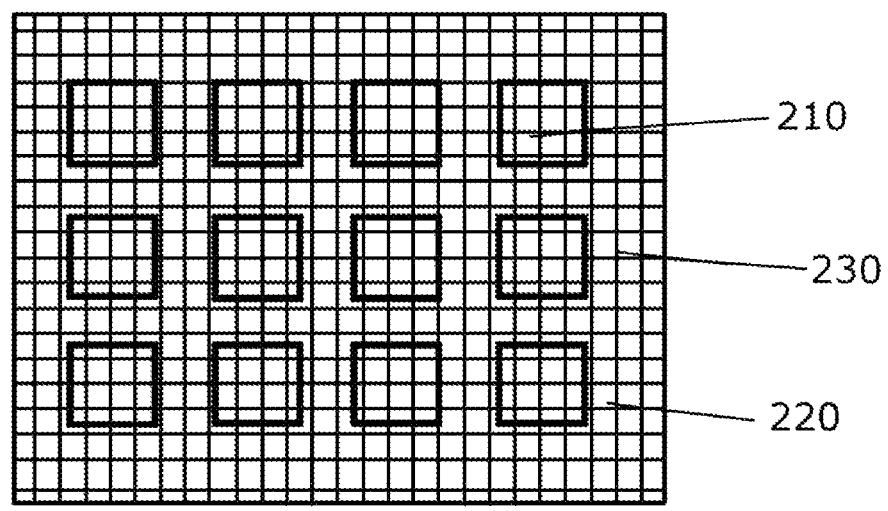
FIGS. 2A, 2B illustrate a schematic top view representation (FIG. 2A) and a cross-sectional side view representation (FIG. 2B) of a plurality of semiconductor chips arranged on a carrier before molding according to the disclosure.
Figure 2B:
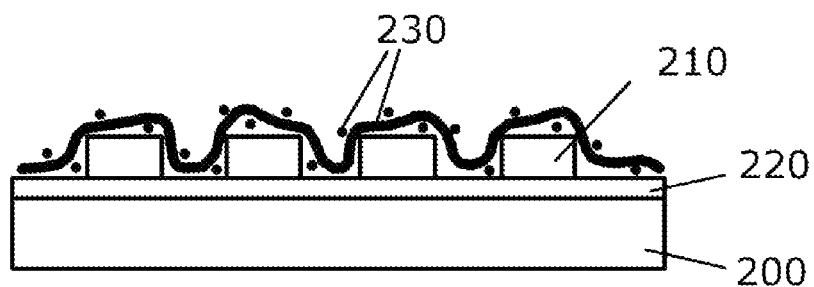

FIGS. 2A, 2B illustrate a schematic top view representation (FIG. 2A) and a cross-sectional side view representation (FIG. 2B) of a plurality of semiconductor chips arranged on a carrier before molding. Semiconductor chips 210 are placed at regular distances from each other on an adhesive foil 220 which is attached to a carrier 200. The carrier 200 can have a circular shape like, for example, the shape of a wafer or it can also have a rectangular like a quadratic shape. In any case the carrier 200 has dimensions so as to be inserted on one of the upper and lower tools of a molding apparatus. The semiconductor chips 210 have been pre-fabricated on a semiconductor wafer and diced out of the semiconductor wafer so that they are freely portable and can be positioned by, for example, a pick-and-place machine onto the adhesive foil 220. Thereafter, a mat or mesh of fibers 230 like, for example, glass fibers is applied onto the plurality of semiconductor chips 210. The fibers 230 are interconnected in the form of a mesh-like or grid-like network wherein one half of the fibers 230 are oriented in one direction and the other half of the fibers 230 are oriented in another direction with a right angle with respect to the one direction wherein the fibers 230 within each one of the directions are equally spaced to another. The fibrous mat can be simply laid down on the plurality of the semiconductor chips 210 and may be fixed with an adhesive to the adhesive foil at the side edges thereof. In the example of FIGS. 2A, 2B the fibers extend laterally besides and between the semiconductor chips 210 as well as above the semiconductor chips. The arrangement as shown in FIG. 2B will be inserted on a lower tool of a molding apparatus and an encapsulation material will be molded over the semiconductor chips 210. Thereafter, the encapsulation layer is cured or hardened and the carrier 200 is taken out of the molding apparatus and the molded semiconductor chips can be processed further.

Figure 3A:
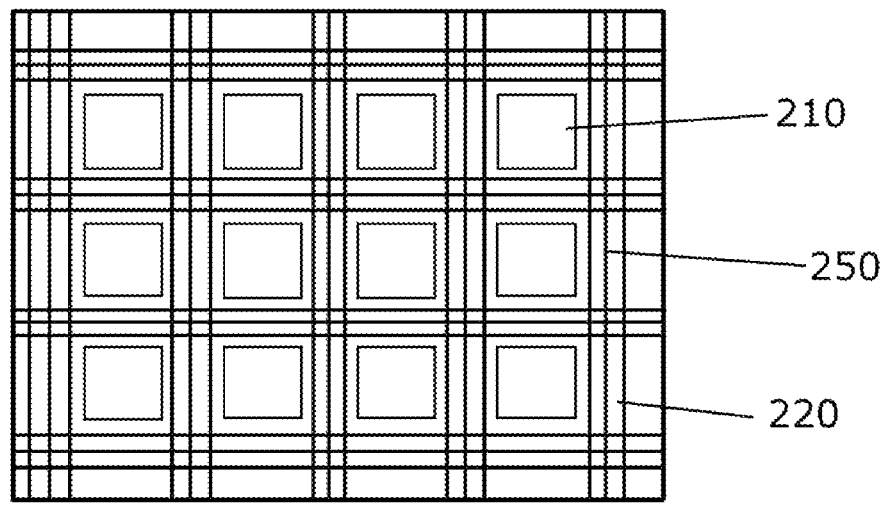
FIGS. 3A, 3B illustrate a schematic top view representation (FIG. 3A) and a cross-sectional side view representation (FIG. 3B) of a plurality of semiconductor chips arranged on a carrier before molding according to the disclosure.
Figure 3B:
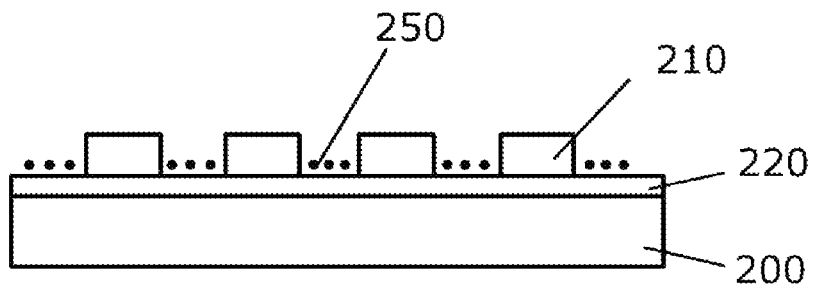

FIGS. 3A, 3B illustrate a schematic top view representation (FIG. 3A) and a cross-sectional side view representation (FIG. 3B) of a plurality of semiconductor chips arranged on a carrier according to another example. This example is similar to the one of FIGS. 2A, 2B insofar as the same reference numerals have been used. In the example of FIGS. 3A, 3B, however, the fibers 250 are arranged in a different form as compared with the example of FIGS. 2A, 2B. The fibers 250 are also interconnected in the form of a mesh-like or grid-like structure but they only extend laterally beside and between the semiconductor chips 210 but not above the semiconductor chips 210. In the top view of FIG. 3A it can be seen that the fibrous mat of fibers 250 may have been fabricated at first in the same way as the fibrous mat of fibers 230 of FIGS. 2A, 2B but thereafter certain areas were cut out of the fibrous mat in which areas of the semiconductor chips 210 are intended to be disposed. In this way it is guaranteed that the fibers 250 will only extend laterally beside and between the semiconductor chips 210 and not laterally above the semiconductor chips 210.

It is to be understood that the examples of FIGS. 2A, 2B and 3A, 3B can be formed with and mixed-up with anyone of the features and embodiments as described in connection with the method of FIG. 1.

Figure 4A:
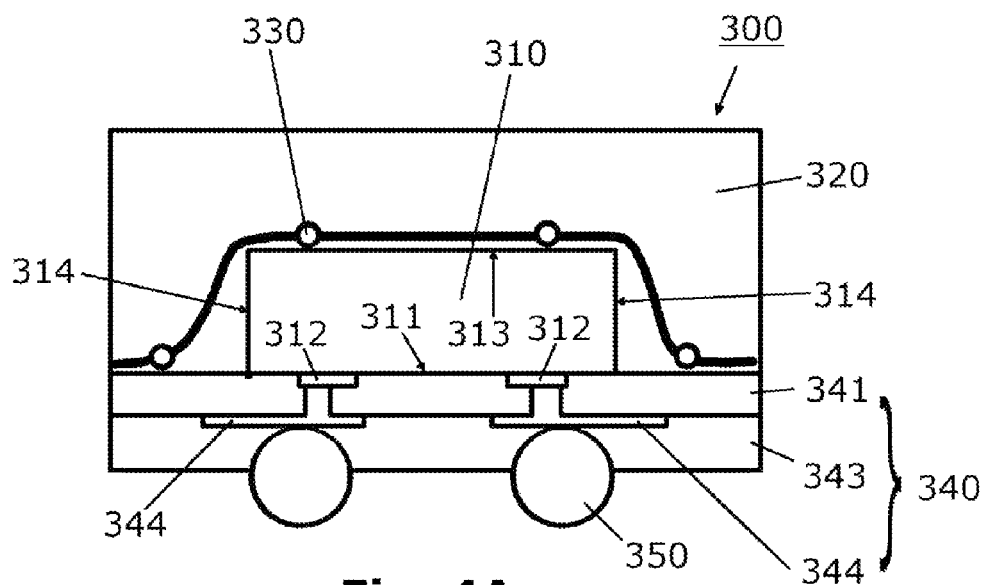
FIGS. 4A, 4B illustrate a schematic cross-sectional side view representation (FIG. 4A) and a top view representation (FIG. 4B) of an exemplary semiconductor device according to a second aspect of the disclosure.
Figure 4B:
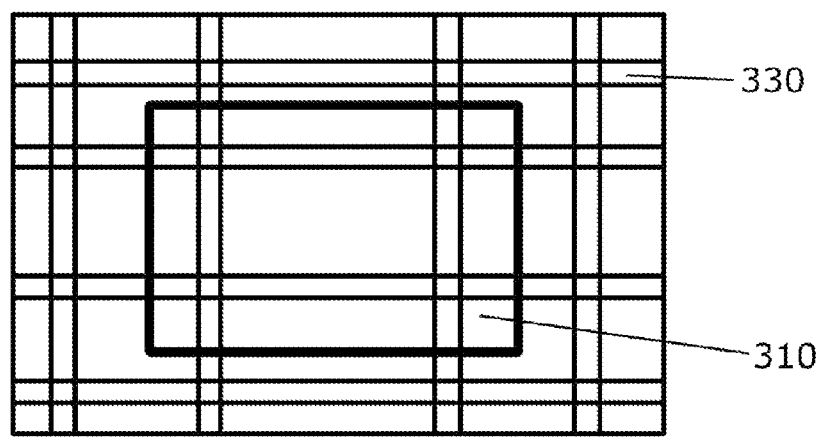

FIGS. 4A, 4B illustrate a schematic cross-sectional side view representation (FIG. 4A) and a top view representation (FIG. 4B) of a semiconductor device according to the second aspect. The semiconductor device 300 comprises a semiconductor chip 310 and a fiber enforced encapsulation layer 320 at least partly covering the semiconductor chip 310.

The semiconductor chip 310 may comprise a first main surface 311 and electrical contact elements 312 disposed on the first main surface 311. The semiconductor chip 310 may further comprise a second main surface 313 opposed to the first main surface 311 and side faces 314 connecting the first and second main surfaces 311 and 313. The semiconductor chip 310 can be of a rectangular, in particular quadratic shape, as can be seen in the top view of FIG. 4B.

The encapsulation layer 320 includes fibers 330 embedded therein in such a manner that each one of the fibers 330 extend from one surface of the encapsulation layer 320 to another opposing surface of the encapsulation layer 320. The fibers 330 can, for example, be glass fibers which are interconnected in the form of a grid-like or mesh-like network. The semiconductor device 300 is, for example, obtained after singulating a molded semiconductor chip panel as shown in the example of FIG. 2A. According to this example, the fibers 330 can also extend above the semiconductor chip 310. It is also possible, however, that the fibers only extend laterally besides the side faces 314 of the semiconductor chip 310.

The semiconductor device 300 may further comprise a redistribution layer 340 disposed on the first main surface 311 of the semiconductor chip 310 and on the first, lower surface of the encapsulation layer 320. The redistribution layer 340 serves to connect the electrical contact elements 312 of the semiconductor chip 310 to outer electrical contact elements, in particular to electrical solder bumps 350. The redistribution layer 340 may comprise a first dielectric or insulating layer 341 and a solder resist layer 343. The electrical contact elements 312 are electrically connected with electrical contact areas 344 disposed on a lower surface of the dielectric layer 341 by electrical through-connections formed in the dielectric layer 341. The solder resist layer 343 is formed on the electrical contact areas 344 and the dielectric layer 341 and comprises openings into which the electrical solder bumps 350 are deposited.

It is to be noted that the way of connecting the electrical contact elements 312 of the semiconductor chip 310 to the solder bumps 350 by the redistribution layer 340 is only exemplary and also other ways of connecting the electrical contact elements 312 to external contact elements can be pursuit.

It should be further noted that the semiconductor device 300 can be formed or provided with any one of the features and embodiments as described in connection with the method for fabricating a semiconductor device described above in connection with FIG. 1.

Figure 5A:
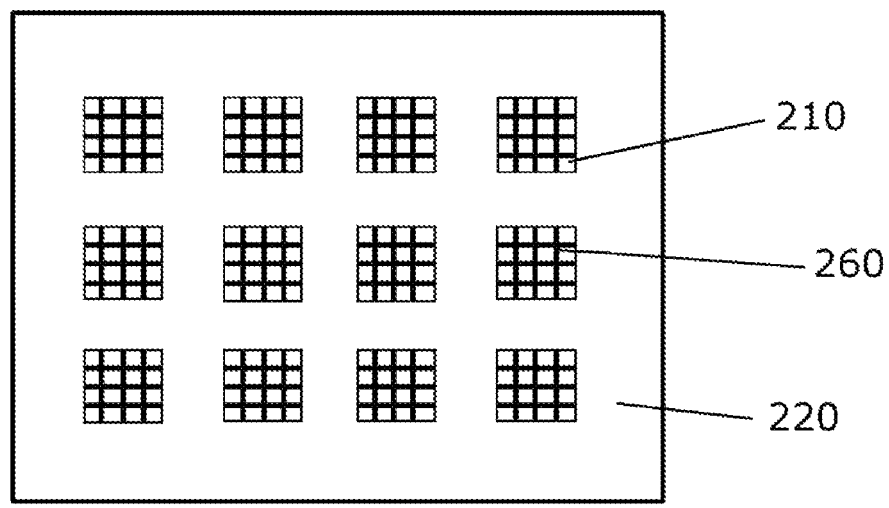
FIGS. 5A, 5B illustrate a schematic top view representation (FIG. 5A) and a cross-sectional side view representation (FIG. 5B) of a plurality of semiconductor chips arranged on a carrier before molding according to the disclosure.
Figure 5B:
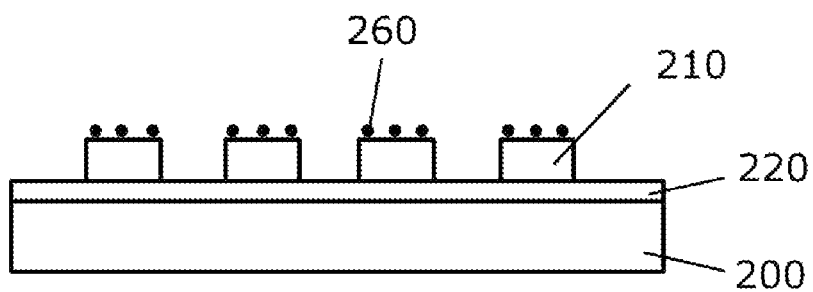

FIGS. 5A, 5B illustrate a schematic top view representation (FIG. 5A) and a cross-sectional side view representation (FIG. 5B) of a plurality of semiconductor chips arranged on a carrier according to a further example. This example is similar to the ones of FIGS. 2A, 2B, 3A and 3B insofar as the same reference numerals have been used. In the examples of FIGS. 5A and 5B, however, the fibers 260 are arranged in a different form as compared to examples described beforehand. The fibers 260 are also interconnected in form of a mesh-like or grid like structure, but these mesh-like or grid-like structures are arranged only above the semiconductor chips 210, but not in the space between them.

Figure 6A:
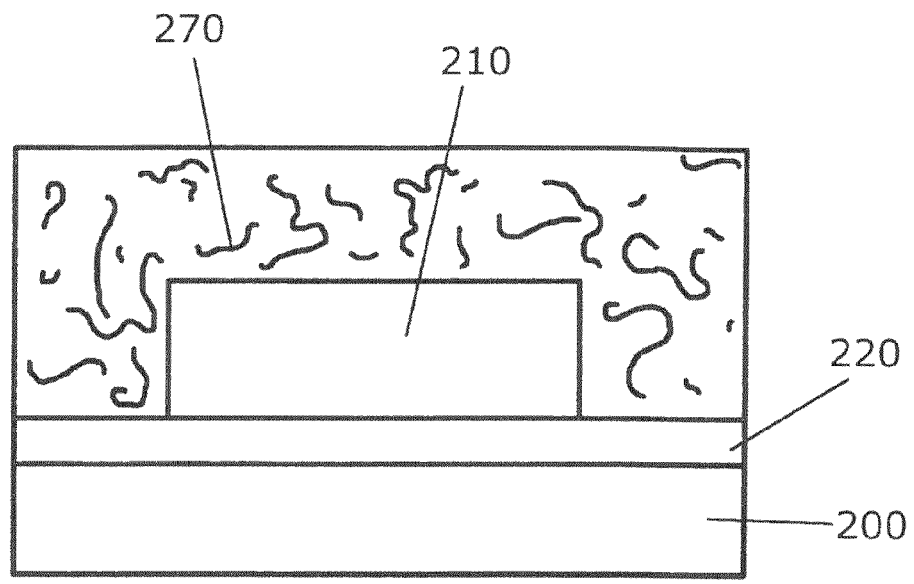
FIGS. 6A, 6B illustrate a schematic cross-sectional side view representation (FIG. 6A) and a schematic top view representation (FIG. 6B) of a semiconductor chip arranged on a carrier according to a further example.
Figure 6B:
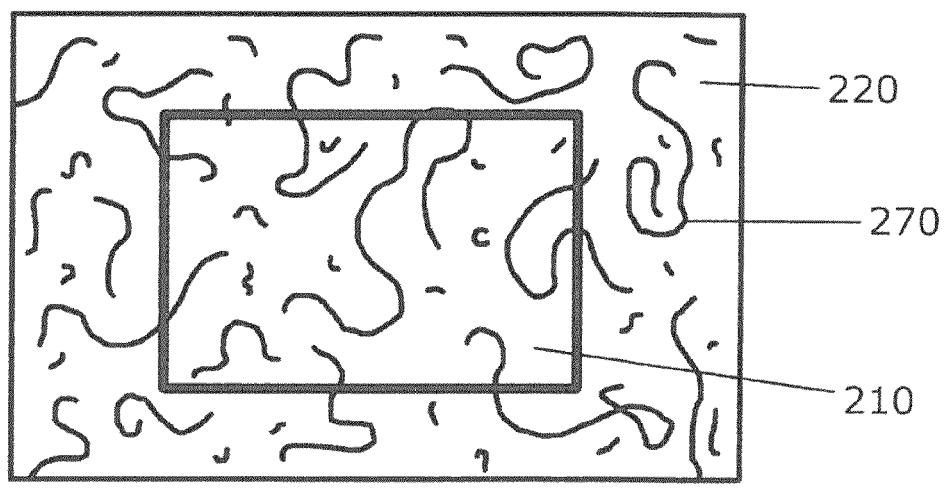

FIGS. 6A, 6B illustrate a schematic cross-sectional side view representation (FIG. 6A) and a schematic top view representation (FIG. 6B) of a semiconductor chip arranged on a carrier according to a further example. This example is similar to the ones of FIGS. 2A, 2B, 3A and 3B insofar as the same reference numbers have been used where applicable. In the examples of FIGS. 6A and 6B, however, the fibers 270 are arranged in a different form as compared to the examples described beforehand. The fibers 270 are not interconnected in the form of a mesh-like or grid-like structure, but are separate and loose within the encapsulation material.

While the invention has been illustrated and described with respect to one or more implementations, alterations and/or modifications may be made to the illustrated examples without departing from the spirit and scope of the appended claims. In particular with regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:
1. A method for fabricating a semiconductor device, the method comprising:
   placing a semiconductor chip onto a carrier; and
   applying a fiber reinforced encapsulant material over the semiconductor chip, wherein applying the fiber reinforced encapsulant material comprises applying the fiber reinforced encapsulant material in such a way that the fibers extend only laterally beside the semiconductor chip.

2. The method according to claim 1, wherein the fibers comprise one or more of organic fibers, inorganic fibers, glass fibers, carbon fibers, plastic fibers, basalt fibers, natural fibers, ceramic fibers, and metal fibers.

3. The method according to claim 1, wherein the fibers are interconnected forming one or more of a mat, a mesh, a woven material, a knit, a braid, and a unidirectional fiber sheet.

4. The method according to claim 1, wherein applying the fiber reinforced encapsulant material comprises transfer molding or compression molding.

5. The method according to claim 1, wherein applying the fiber reinforced encapsulant material comprises:
   placing the carrier with the semiconductor chip into a molding apparatus;
   applying a fiber layer onto the semiconductor chip;
   molding an encapsulant material over the semiconductor chip and the fiber layer; and
   curing the encapsulant material.

6. The method according to claim 1,
   wherein providing the semiconductor chip comprises providing a plurality of semiconductor chips;
   wherein placing the semiconductor chip comprises placing the semiconductor chips onto the carrier;
   wherein applying the fiber reinforced encapsulant material comprises fabricating a panel by applying the fiber reinforced encapsulant material over the plurality of semiconductor chips; and
   wherein the method further comprises singulating the panel to obtain a plurality of semiconductor devices.

7. The method according to claim 1, wherein the fiber reinforced encapsulant material includes a fiber reinforced plastic material.

8. The method according to claim 1, wherein the fiber reinforced encapsulant material comprises a fiber reinforced duroplastic material, or a fiber reinforced resin material, or a fiber reinforced epoxy resin material.

9. A semiconductor device, comprising:
   a semiconductor chip; and
   a fiber reinforced encapsulation layer at least partly covering the semiconductor chip, wherein fibers of the fiber reinforced encapsulation layer extend only laterally beside the semiconductor chip.

10. The semiconductor device according to claim 9, wherein the fiber reinforced encapsulation layer comprises organic fibers, inorganic fibers, glass fibers, carbon fibers, plastic fibers, basalt fibers, natural fibers, ceramic fibers, and/or metal fibers.

11. The semiconductor device according to claim 9, wherein the fiber reinforced encapsulation layer comprises fibers interconnected forming one or more of a mat, a mesh, a woven material, a knit, a braid, and a unidirectional fiber sheet.

12. The semiconductor device according to claim 9, wherein the fiber reinforced encapsulant layer comprises a fiber reinforced duroplastic material or a fiber reinforced resin material or a fiber reinforced epoxy resin material.

13. The semiconductor device according to claim 9, wherein the fiber reinforced encapsulation layer comprises an elastic modulus greater than 1 GPa.

14. The semiconductor device according to claim 9, wherein the fiber reinforced encapsulation layer comprises a coefficient of thermal expansion smaller than $10^{-5}$ $K^{-1}$.

15. The semiconductor device according to claim 9, wherein the fiber reinforced encapsulation layer comprises a plurality of fibers, each fiber extending from one surface of the fiber reinforced encapsulation layer to another surface of the fiber reinforced encapsulation layer.

16. A semiconductor device, comprising:
   a semiconductor chip having a first main face and a second main face, the semiconductor chip comprising electrical contacts on the second main opposite to the first main face; and
   a fiber reinforced encapsulation layer at least partly covering the semiconductor chip, wherein fibers of the fiber reinforced encapsulation layer extend only above the first main face of the semiconductor chip and within boundaries of a projection of the semiconductor chip.

17. The semiconductor device according to claim 16, wherein the fibers comprise organic fibers, inorganic fibers, glass fibers, carbon fibers, plastic fibers, basalt fibers, natural fibers, ceramic fibers, and/or metal fibers.

18. The semiconductor device according to claim 16, wherein the fibers are interconnected forming one or more of a mat, a mesh, a woven material, a knit, a braid, and a unidirectional fiber sheet.

* * * * *